United States Patent

Schröder

[11] Patent Number: 4,591,733
[45] Date of Patent: May 27, 1986

[54] CIRCUIT ARRANGEMENT FOR GENERATING A CONTROL VOLTAGE WHICH IS DEPENDENT UPON AN ALTERNATING VOLTAGE

[75] Inventor: Ernst Schröder, Hanover, Fed. Rep. of Germany

[73] Assignee: Licentia Patent-Verwaltungs-GmbH, Frankfurt am Main, Fed. Rep. of Germany

[21] Appl. No.: 458,045

[22] Filed: Jan. 14, 1983

[30] Foreign Application Priority Data

Jan. 15, 1982 [DE] Fed. Rep. of Germany ....... 3201030
Oct. 22, 1982 [DE] Fed. Rep. of Germany ....... 3239138

[51] Int. Cl.$^4$ .................. H03K 17/56; H03K 5/00; H03K 5/13
[52] U.S. Cl. .................. 307/246; 307/261; 307/592; 307/597
[58] Field of Search .................. 330/278, 279, 281; 307/246, 261, 592, 593, 597, 297, 296 A, 493, 247 A, 247 R; 328/150, 151, 26, 28

[56] References Cited

U.S. PATENT DOCUMENTS

| | | | |
|---|---|---|---|
| 3,259,849 | 7/1966 | Willett et al. | 307/592 |
| 3,716,801 | 2/1973 | Minner. | |
| 3,848,194 | 11/1974 | Nishimura et al. | 330/281 |
| 3,969,680 | 7/1976 | Wermuth. | |
| 4,220,929 | 9/1980 | Talbot et al. | 330/279 |
| 4,270,103 | 5/1981 | Schröder. | |
| 4,318,009 | 3/1982 | Schröder. | |
| 4,321,482 | 3/1982 | Schröder et al. | |
| 4,322,636 | 3/1982 | Schröder et al. | |
| 4,422,049 | 12/1983 | Akagiri et al. | 330/281 |

FOREIGN PATENT DOCUMENTS 2850736 8/1979 Fed. Rep. of Germany.
2017458 10/1979 United Kingdom.

Primary Examiner—Stanley D. Miller
Assistant Examiner—Timothy P. Callahan
Attorney, Agent, or Firm—Spencer & Frank

[57] ABSTRACT

A circuit arrangement for generating a control voltage which is dependent upon an alternating voltage. A charging capacitor is provided which has a charge that is representative of the control voltage which can be varied by controllable charging and discharging of the capacitor. A charging circuit including a transistor is connected so that the alternating voltage is coupled to the transistor base and the transistor collector-emitter path is connected between a charging current source and the capacitor for charging the capacitor under control of the amplitude of the alternating voltage, with the collector voltage of the transistor being representative of the charge state of the capacitor. A capacitor discharge circuit is connected to provide a discharge path for the capacitor, the discharge path having a variable conductance. A capacitor discharge control unit, including a delay member is connected for increasing the conductance of the discharge path in dependence on the time elapsed after a decrease of the alternating voltage amplitude.

10 Claims, 7 Drawing Figures

CIRCUIT ARRANGEMENT FOR GENERATING A CONTROL VOLTAGE WHICH IS DEPENDENT UPON AN ALTERNATING VOLTAGE

BACKGROUND OF THE INVENTION

The present invention relates to a circuit arrangement for generating a control voltage which is dependent upon an alternating voltage.

Such circuit arrangements are disclosed in applicant's U.S. Pat. Nos. 4,321,482 and 4,322,636. It is possible to use these circuit arrangements as control voltage generators in compander systems as disclosed, for example, in U.S. Pat. No. 3,969,680 issued to Jürgen Wermuth.

In such a compander circuit, the input of the control voltage generator is connected in a useful signal path containing an electronically gain controlled amplifier and receives the alternating voltage output signal of that gain controlled amplifier for compression operation or the alternating voltage input signal of such gain controlled amplifier for expansion operation. The direct voltage output signal from the control voltage generator is fed to the control input of the amplifier disposed in the useful signal path.

The control voltage generator here acts in such a manner that, if the alternating voltage fed to the input of the control voltage generator increases rapidly, the control voltage generator generates a direct voltage which rapidly changes in magnitude and which quickly changes the gain of the amplifier disposed in the useful signal path. A rapid change in the gain of the gain controlled amplifier disposed in the useful signal path is of particular importance if the level of the useful signal suddenly changes over a wide range. Otherwise, if the signal level jumps from a low to a high value there exists the danger of the compressor output signal overshooting and thus the transmission channel being overdriven. With a level jump in the opposite direction, noise signals would become audible at the output of the expander if the output of the control voltage generator did not change fast enough. While the useful signal was still present, these noise signals would be covered by it. To realize complementary behavior of compressor and expander, it is advisable to consider the features specific for compressor and expander operation with equal weight for both compressor and expander.

The control voltage generator for controlling the gain of the amplifier disposed in the useful signal path must therefore furnish a control voltage which is quickly adapted to the present level of the useful signal. A pre-requisite for this is a short discharge time constant at the charging capacitor of the control voltage generator which becomes effective when there are large jumps in level. In the stationary state or for slow changes in signal level, however, the discharge time constant must be large so that the control voltage does not fluctuate in the rhythm of the useful signal frequency. Such behavior would result in a high distortion factor.

When, in this connection, the terms discharge or charge change are used, it is to be understood that the above considerations apply to circuits in which the charging capacitor is discharged with decreased alternating voltage amplitude as well as to those in which it is charged.

In a determination of the discharging time constant for the charging capacitor, several mutually contradictory requirements must be met so that a circuit arrangement could be provided which controlled the discharging time constant in a manner to provide very reliable protection against overshooting, a low distortion factor and the physiological covering, or masking, effect of noise signals by strong useful signals.

One such circuit arrangement is disclosed in my U.S. Pat. No. 4,318,009. This known solution has the advantage that the delay period of the delay member can be controlled with respect to a short duration of unmasked noise while maintaining a permissible distortion factor.

My U.S. Pat. No. 4,270,103 discloses a rectifier circuit for the compander process disclosed in my U.S. Pat. No. 4,318,009 and which provides sections of linear characteristics by limiting the rectifier voltage.

SUMMARY OF THE INVENTION

It is an object of the present invention to provide a circuit arrangement which does not correspond to the basic principle of U.S. Pat. No. 4,318,009 but which likewise controls the recharging time constants so as to provide very reliable protection against overshooting, a low distortion factor and the physiological masking effect of noise signals by strong useful signals.

The above and other objects are achieved, according to the invention, by the provision of a novel circuit arrangement for generating a control voltage which is dependent upon an alternating voltage, the circuit arrangement comprising: a charging capacitor whose charge state is representative of the control voltage and can be varied by controllable charging and discharging of the capacitor; a charging circuit including a transistor having its collector-emitter path connected between a charging current source and the capacitor for charging the capacitor under control of the amplitude of the alternating voltage, with the collector voltage of the transistor being representative of the charge state of the capacitor; a capacitor discharge circuit connected to provide a discharge path for the capacitor, the discharge path having a variable conductance; and capacitor discharge control means including a delay member connected for increasing the conductance of the discharge path in dependence on the time elapsed after a decrease of the alternating voltage amplitude.

The invention will now be explained with reference to a plurality of embodiments that are illustrated in the drawing.

DESCRIPTION OF THE PREFERRED EMBODIMENTS

Figure 1:
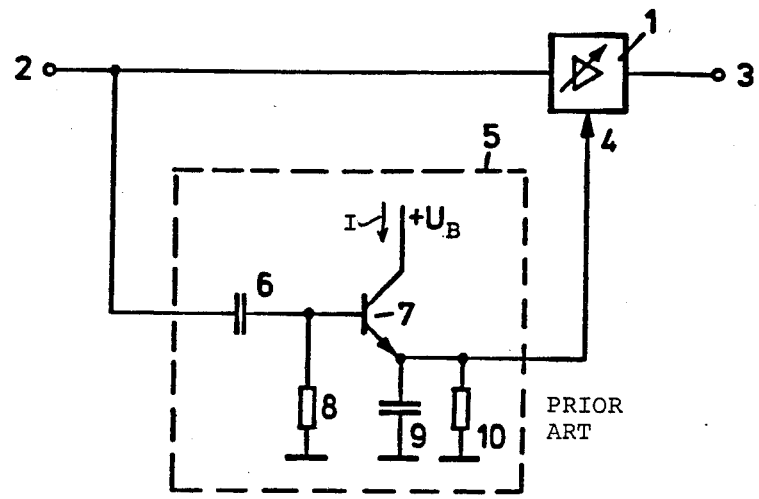
FIG. 1 is a circuit diagram of a simple embodiment of a prior art circuit.

FIG. 1 is a block circuit diagram of a controllable amplifier 1 of the type disclosed in U.S. Pat. No. 3,716,801, which receives an alternating voltage at its input terminal 2. An amplified output voltage or a voltage that has been changed by controls, e.g. has been compressed or expanded, is obtained at output terminal 3. The control input 4 of amplifier 1 is connected to the output of a control circuit 5 whose input is connected to the input terminal 2.

In the control circuit 5, the alternating voltage derived from terminal 2 passes via a capacitor 6 to the base of a transistor 7, which base is simultaneously connected to ground via a resistor 8. In the emitter circuit of transistor 7 there is disposed a charging capacitor 9 which is charged via the collector-emitter path of transistor 7 from an operating voltage source $+V_B$. The charge state of the charging capacitor 9 is a measure of the magnitude of the alternating voltage fed to transistor 7.

The voltage across charging capacitor 9 is transmitted either directly or via a further amplifier to controllable amplifier 1. A discharge resistor 10 is connected in parallel with charging capacitor 9 and simultaneously helps to define the time constant of the circuit while serving to provide a permanant discharge path for capacitor 9.

Figure 2:
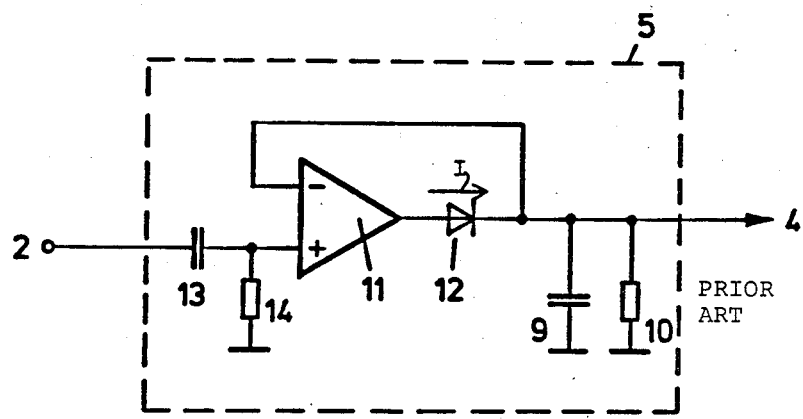
FIG. 2 is a block circuit diagram of a second prior art circuit.

FIG. 2 shows a control circuit 5 similar to that of FIG. 1 with an operational amplifier 11 whose output voltage is fed to a rectifier 12 for charging the charging capacitor 9. The action of the circuit essentially corresponds to that of the circuit of FIG. 1.

Coupling capacitor 13 and discharge resistor 14 correspond to components 6 and 8, respectively, of FIG. 1 but are here dimensioned in such a manner that they are adapted to the input resistance of operational amplifier 11.

The current I flowing every time the charging capacitor 9 is charged is representative of the charge state of capacitor 9. This current flows through transistor 7 of FIG. 1 or diode 12 of FIG. 2.

Figure 3:
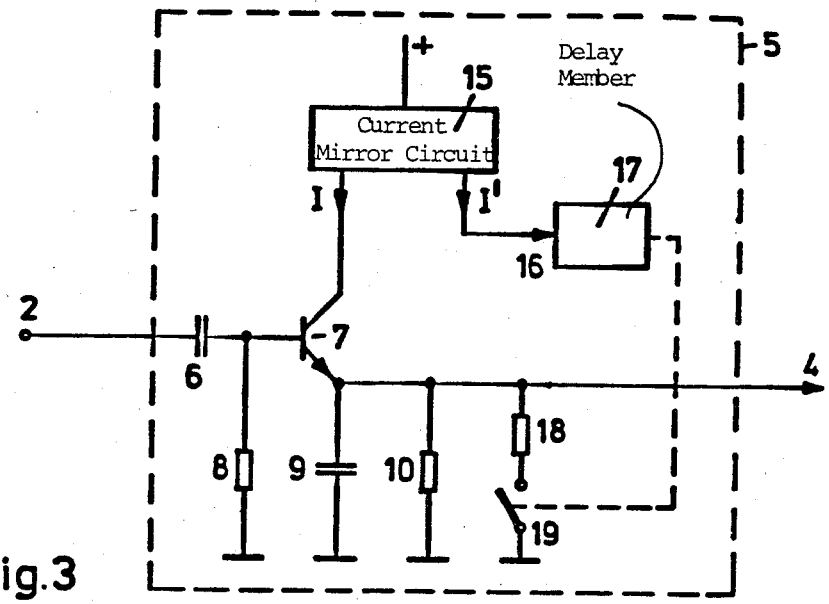
FIG. 3 is a circuit diagram of one preferred embodiment of a circuit according to the present invention.
Figure 4:
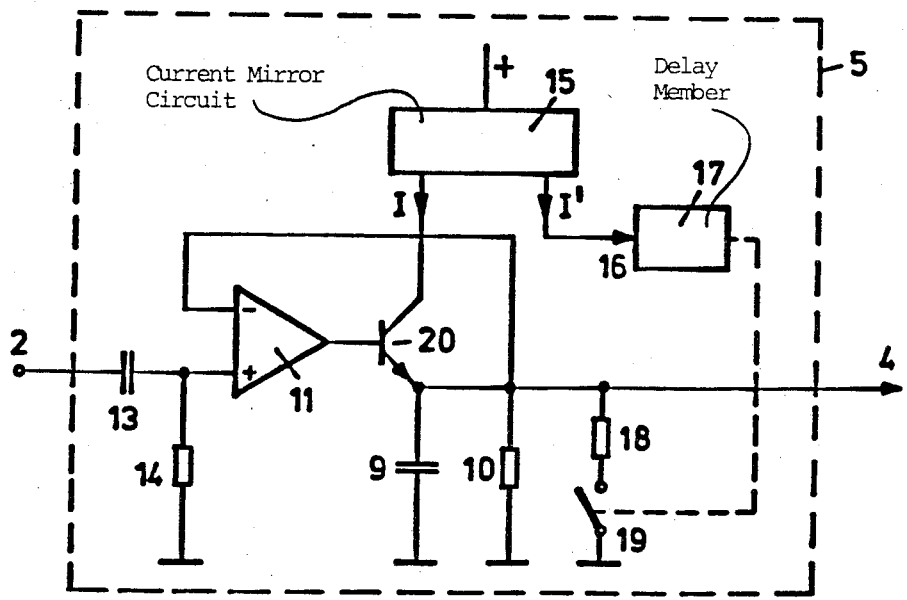
FIGS. 4–6 are circuit diagrams of further embodiments of the invention.

The circuits according to FIGS. 1 and 2 are modified according to the invention to form the circuits shown in FIGS. 3 and 4 in which the magnitude of a parameter of the power supplied to, i.e. the voltage or the current at, the collector of transistor 7 of FIG. 1 or the collector of a transistor 20 which performs the function of diode 12 of FIG. 2 can be evaluated. In these modified circuits, a current mirror circuit 15 is connected to the positive supply voltage and to the collector of transistor 7 or 20 to furnish a current I', which is a mirror current of the charging current I through transistor 20, to the current sensitive input 16 of a multivibrator circuit 17.

Circuit 15 can have a form similar to that of circuit 6 of U.S. Pat. No. 4,318,009.

A so-called retriggerable monoflop as described in AEG-TELEFUNKEN Wissenschaftliche Berichte [Scientific Reports] 1/2, 1979, at page 103, may serve as the multivibrator circuit. The output signal from this multivibrator circuit 17 serves to switch a switch 19 which is connected in series with a resistor 18. The series arrangement of resistor 18 and switch 19 is connected in parallel with resistor 10. Switch 19 may be part of the multivibrator circuit 17.

Figure 5:
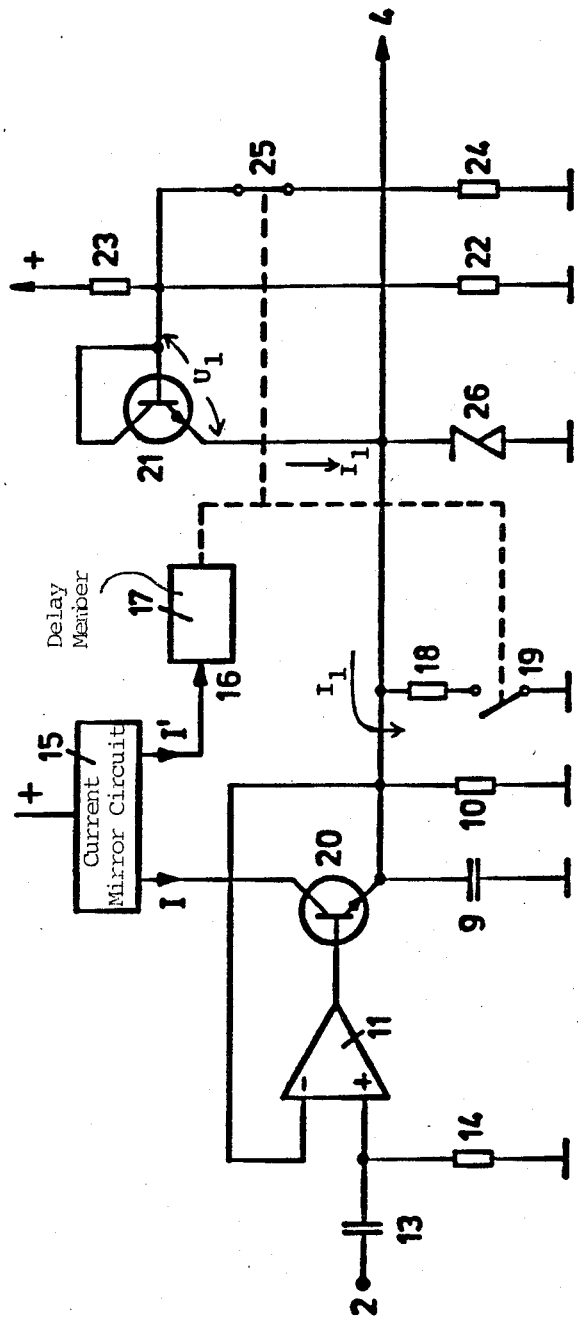

In the circuit of FIG. 5 the capacitor 9 is charged to a voltage corresponding to the positive peak level of the useful input signal at terminal 2. If the value of the input voltage drops, transistor 20 is blocked and capacitor 9 is discharged by resistor 10, and if switch 19 is closed by resistor 18 as well. If the input signal is e.g. a sinusoid, capacitor 9 will again be charged via transistor 20 to the positive peak level during the next positive signal peak. As a result of this action current I is a pulse-like current and is nonzero during the signal peaks of the signal at terminal 2. Its magnitude is dependent on the difference between the peak voltage of the input signal at terminal 2 and the voltage at capacitor 9.

The circuits described so far in connection with FIGS. 3 and 4 improve the behavior of the control voltage generator during a decrease in the amplitude of the alternating voltage supplied to the control circuit.

If the alternating voltage amplitude drops slowly, charging capacitor 9 discharges slowly through resistor 10. The time constant of this slow discharge is dimensioned in such a way that at the lowest signal frequency the maximum permissible distortion factor is just reached. The time constant is determined by the values of capacitor 9 and resistor 10. If broadband (e.g. electroacoustical) signals with a low lower limit frequency are transmitted, a low distortion factor must be maintained by means of a large time constant of the order of magnitude of several seconds.

If the alternating voltage drops quickly, a long discharging time constant is annoying since, for example, during expander operation, the transmission rate is not reduced quickly enough so that interfering noise on the transmission path, which previously had been covered by the strong useful signal, now becomes audible. In the case of a rapid decrease of the alternating voltage amplitude it is therefore necessary to have a short discharging time and thus a small discharging time constant for the control voltage generator.

To realize this, a parameter depending on the charging current I for the charging capacitor 9, such as the collector to ground voltage of transistor 7 or a current I' corresponding to current I, as in the case of FIGS. 3 and 4, may be evaluated. If the amplitude of the useful signal decreases, the charging current I ceases to flow. This can be detected to operate switch 19 so as to connect resistor 18 in parallel with resistor 10. Thus, the discharge of capacitor 9 is accelerated, for example, by a factor of 10. The detection of the magnitude of the current I can be accomplished by direct measurement of the current I or of the current I' or by detection of a change in the collector to ground voltage of transistor 7,20 if its collector is connected via a resistor to the power supply voltage.

Under consideration of an undistorted reproduction of the last oscillation train of a strong, or high amplitude, useful signal, however, the switching to the small time constant must not occur until the last oscillation train is completed. For this purpose, a retriggerable monostable multivibrator stage 17 is included between the current I' output of current mirror 15 and switch 19 with the result that switch 19 is opened immediately everytime a charging current I is flowing due to an increasing input signal at terminal 2 and that switch 19 is closed only after a certain delay once current I' becomes zero. Since the longest oscillation duration occurs at the lowest signal frequency, the delay period for switching from the large to the small time constant must be dimensioned according to the lowest signal frequency. If the useful signal amplitude goes back to a small value before this delay period has expired, uncovered noise appears at the output of the expander; however, the human ear requires a certain time to change from adaptation to a loud sound impression to adaptation to a soft sound impression. The uncovered noise is therefore not noticed if the delay period for switching the time constant is selected to be shorter than the physiological adaptation time of the human ear.

In circuits according to FIGS. 3 to 5 the delay period should be larger than 20 ms for a lowest useful signal frequency of 50 Hz but shorter than the approximately 100 ms adaptation time of the human ear.

My U.S. Pat. No. 4,270,103 discloses a rectifier circuit for a compander process as described in my U.S. Pat. No. 4,318,009, which establishes individual linear characteristic parts by limiting the rectifier voltage.

To establish such linear characteristic parts in a circuit arrangement of the type shown in FIG. 4, the following circuit elements are provided, as shown in FIG. 5. A resistor 23 is connected between the supply voltage and the base and collector of a transistor 21 which is connected as a diode. Resistor 23 is also connected between the voltage supply and a resistor 22 and a series connection of a switch 25 and a resistor 24. The emitter of transistor 21 leads to the output terminal 4. Switches 19 and 25 are effectively coupled to operate together. Moreover, the output terminal 4 is connected to ground via a Zener diode 26.

In the positive direction, i.e. in the direction of a large control voltage, the control voltage is limited at point 4 by Zener diode 26. To fix the minimum value of the control voltage, the output 4 is connected to a reference voltage derived from the supply voltage, via the base-emitter path of transistor 21. This reference voltage must be higher by the base-emitter voltage drop of transistor 21 than the minimum voltage desired at output 4. The reference voltage of this circuit is derived from the supply voltage by a voltage divider composed of the series connection of resistor 23 with the parallel arrangement composed of resistor 22 and the series connection of switch 25 and resistor 24.

If no input signal is present at input terminal 2, switch 19 is closed and transistor 20 is blocked. Thus resistors 18 and 10 are connected in parallel. Corresponding to the desired minimum control voltage at output 4, a current $I_1$ results which flows through resistors 18 and 10. This current $I_1$ also flows through the base-emitter path of transistor 21 and there causes a voltage drop $V_1$:

$$V_1 = \frac{k \cdot T}{q} \cdot \ln(I_1/I_0) \approx 26 \text{ mV} \cdot \ln(I_1/I_0)$$

wherein k is the Boltzmann constant, T the absolute temperature and q the unit of electric charge. $I_0$ is a material constant and is, for customary silicon transistors, approximately $$I_0 \approx 10^{-14} A.$$

If an input signal applied to the input 2 has a magnitude considerably greater than the signal corresponding to the desired bend in the characteristic, capacitor 9 will be charged to a voltage considerably greater than the desired minimum voltage at output 4. Transistor (diode) 21 thereby becomes reverse-biased and current $I_1$ ceases to flow. The current I then flowing through the transistor 20 is mirrored in the current mirror circuit 15. The mirrored current I' triggers the multivibrator circuit 17, via current input 16, and switch 19 is opened. So far the circuit of FIG. 5 works like the circuit of FIG. 4.

But if now an input signal is applied to input 2 of a magnitude slightly greater than the signal corresponding to the desired bend in the characteristic, transistor 20 becomes temporarily conductive during the signal peaks. The multivibrator 17 will also be triggered and switch 19 will be opened, but transistor (diode) 21 will not become reverse-biased and continues furnishing a current $I_1$. Since now resistor 18 is no longer connected in parallel with resistor 10, the current furnished by transistor (diode) 21 to limit the control voltage across terminal 4 is reduced to a minimum value from $I_1$ to $I_1'$.

This also reduces the base-emitter voltage drop of transistor 21 from $V_1$ to $V_1'$.

If the value of resistor 10 by itself is, for example, 10 times greater than the parallel connection of resistors 10 and 18, the following applies:

$$I_1' \approx 0.1 \cdot I_1$$

The base-emitter voltage drop changes by:

$$V_1 - V_1' = \frac{k \cdot T}{q} \ln(I_1/I_1')$$

and for the base example by:
$$V_1 - V_1' \approx 26 \text{ mV} \cdot \ln 10 \approx 60 \text{ mV}$$

Thus, the minimum control voltage determined by transistor 21 and resistors 22 and 23 increases by 60 mV. This is undesirable and leads to distortions in the region of the lower bend of the desired sectionally linear characteristics of a compander. According to the invention, the thus produced increase in the minimum control voltage across output 4 can be compensated in that opening of switch 19 causes the reference voltage to be lowered by the difference between the voltage drops of transistor 21. This is accomplished, for example, in that at the same time switch 19 is opened, switch 25 is closed, thus changing the voltage divider for generating the reference voltage by connection of resistor 24 in parallel such that the desired change in the reference voltage results.

Figure 6:
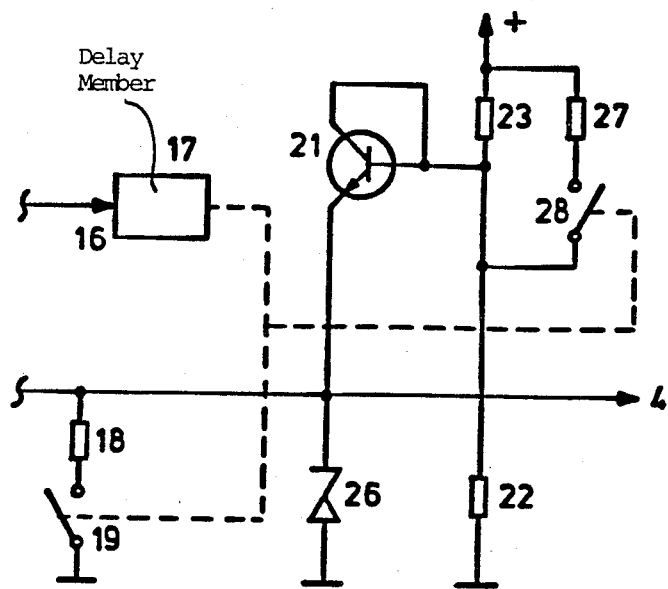

FIG. 6 is a circuit diagram of a further embodiment for adapting the reference voltage to changing operating conditions. This circuit diagram corresponds to a portion of the circuit of FIG. 5 and shows Zener diode 26, transistor 21, and resistors 22 and 23, which are connected in series. Further, the series arrangement of a resistor 27 and a switch 28 is connected in parallel with resistor 23. Switches 19 and 28 are operated in synchronism as in the preceding embodiment. Here, if switch 19 opens, switch 28 opens as well. Thus voltage divider 23, 22 is changed in such a manner that the desired change in the reference voltage is realized as well.

It is understood that any other circuit can be used which changes by the desired amount a reference voltage across the base of transistor 21 in synchronism with the switching of switch 19.

Figure 7:
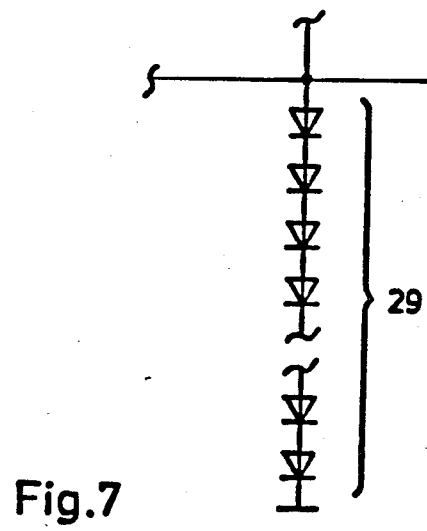
FIG. 7 is a diagram of a component which can be used in the embodiments of FIGS. 5 and 6.

FIG. 7 shows the series connection of a number of diodes 29 which produces the limitation of the maximum value of the control voltage instead of the Zener diode 26.

It will be understood that the above description of the present invention is susceptible to various modifications, changes and adaptations, and the same are intended to be comprehended within the meaning and range of equivalents of the appended claims.

What is claimed is:

1. A circuit arrangement for generating a control voltage which is dependent upon an alternating voltage, said circuit arrangement comprising: a charging capacitor whose charge state is representative of the control voltage and can be varied by controllable charging and discharging of said capacitor; a charging current source; a charging circuit including a transistor having its base coupled to the alternating voltage, its collector connected to said charging current source and its emitter connected to said capacitor for charging said capacitor under control of the amplitude of the alternating voltage, with the collector voltage of said transistor being representative of the charge state of said capacitor; a capacitor discharge circuit connected in parallel to said capacitor to provide a discharge path for said capacitor, said discharge path having a variable conductance; a delay member connected to said capacitor discharge circuit; and capacitor discharge control means including an evaluation circuit responsive to a signal representative of the collector voltage or current of said transistor connected via said delay member to said capacitor discharge circuit for controlling the conductance of said discharge path in dependence on the time elapsed after a decrease of the alternating voltage amplitude for increasing the conductance of said discharge path in response to a predetermined decrease in the amplitude of the alternating voltage.

2. A circuit arrangement as defined in claim 1 wherein said charging current source and said evaluation circuit are comprised of a current mirror circuit connected to the collector of said transistor and to said delay member for supplying a charging current to said transistor and for supplying a mirror current of the charging current to said delay member.

3. A circuit arrangement as defined in claim 2 wherein said delay member is a monoflop circuit.

4. A circuit arrangement as defined in claim 1 further comprising: control voltage limiting means coupled to said capacitor for limiting the control voltage to a predetermined maximum value; and means for setting a minimum permissible control voltage value and including a first switch operable for maintaining the minimum permissible value at a predetermined level in response to changes in the operation of said circuit arrangement.

5. A circuit arrangement as defined in claim 4 wherein said means for setting a minimum control voltage value comprise a reference voltage source.

6. A circuit arrangement as defined in claim 5 wherein said switch is connected such that a change in its switching state effects a corresponding change in the value of the reference voltage.

7. A circuit arrangement as defined in claim 4 wherein said control voltage limiting means comprises a Zener diode.

8. A circuit arrangement as defined in claim 4 wherein said control voltage limiting means comprises a series arrangement of a plurality of diodes.

9. A circuit arrangement as defined in claim 4 wherein said capacitor discharge circuit comprises a second switch connected so that its switching state determines the conductance of said discharge path.

10. A circuit arrangement as defined in claim 9 further comprising means for changing the switching states of said first and second switches simultaneously.

* * * * *